(12) United States Patent
Ting et al.

(10) Patent No.: US 11,817,049 B2
(45) Date of Patent: *Nov. 14, 2023

(54) ELECTRONIC DEVICE (71) Applicant: Innolux Corporation, Miao-Li County (TW)

(72) Inventors: Chin-Lung Ting, Miao-Li County (TW); Chien-Chih Chen, Miao-Li County (TW); Ti Chung Chang, Miao-Li County (TW); Chih-Chieh Wang, Miao-Li County (TW); Jenhung Li, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/961,578

(22) Filed: Oct. 7, 2022

(65) Prior Publication Data

US 2023/0035179 A1  Feb. 2, 2023

Related U.S. Application Data (63) Continuation of application No. 17/308,041, filed on May 4, 2021, now Pat. No. 11,501,701.

(60) Provisional application No. 63/031,581, filed on May 29, 2020.

(30) Foreign Application Priority Data

Dec. 18, 2020 (CN) .......................... 202011504933.6

(51) Int. Cl.
  G09G 5/00 (2006.01)
  G09G 3/3208 (2016.01)

(52) U.S. Cl.
  CPC ....... *G09G 3/3208* (2013.01); *G09G 2360/14* (2013.01)

(58) Field of Classification Search
  CPC ............. G09G 3/3208; G09G 2360/14; G09G 2354/00; H10K 59/65
  See application file for complete search history.

(56) References Cited

U.S. PATENT DOCUMENTS

2021/0126078 A1* 4/2021 Lee ........................ H10K 59/88

* cited by examiner

Primary Examiner — Adam R. Giesy
(74) Attorney, Agent, or Firm — JCIPRNET (57) ABSTRACT

A display panel and a spliced display are provided. The display panel includes a substrate, a plurality of light-emitting elements, a driving circuit, and an optical sensor. The substrate includes a through hole, and the through hole includes a hole. The plurality of light-emitting elements are disposed on the substrate. The through hole is located in a region between two of the plurality of light-emitting elements. The driving circuit is disposed on the substrate and electrically connected to the plurality of light-emitting elements. The optical sensor is disposed corresponding to the through hole and receives sensing light through the hole. The width W of the hole meets the equation of H≤W<D. H is the depth of the hole, and D is the distance between the two of the plurality of light-emitting elements.

9 Claims, 6 Drawing Sheets

ELECTRONIC DEVICE

CROSS-REFERENCE TO RELATED APPLICATION

This application is a continuation application of and claims the priority benefit of a prior application Ser. No. 17/308,041, filed on May 4, 2021, now allowed. The prior application Ser. No. 17/308,041 claims the priority benefit of U.S. provisional application serial no. 63/031,581, filed on May 29, 2020, and China application serial no. 202011504933.6, filed on Dec. 18, 2020. The entirety of each of the above-mentioned patent applications is hereby incorporated by reference herein and made a part of this specification.

BACKGROUND

Technical Field

The disclosure relates to an electronic device, and particularly, to a display panel and a spliced display.

Description of Related Art

With the advancement of technology, electronic devices (e.g., display devices) are evolving toward more functions and getting thinner and lighter. Technologies to connect an external camera lens to a display screen are proposed. However, the circuit configuration of the peripheral area of a panel and the user experience of a display device still need to be optimized.

Moreover, in large-scale display devices, the external camera lens may not meet the usage requirements. Therefore, the current display device still has room for improvement.

SUMMARY

The disclosure provides a display panel and a spliced display contributing to improving at least one of shortcomings of an external camera lens.

According to an embodiment of the disclosure, a display panel includes a substrate, a plurality of light-emitting elements, a driving circuit, and an optical sensor. The substrate includes a through hole, and the through hole includes a hole. The plurality of the light-emitting elements are disposed on the substrate. The through hole is located in a region between two of the plurality of the light-emitting elements. The driving circuit is disposed on the substrate and electrically connected to the plurality of the light-emitting elements. The optical sensor is disposed corresponding to the through hole and receives sensing light through the hole. A width W of the hole meets the equation of H≤W<D. H is a depth of the hole, and D is a distance between the two of the plurality of the light-emitting elements.

According to an embodiment of the disclosure, a spliced display includes at least one display panel described.

In order to make the features and advantages of the disclosure comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the disclosure and, together with the description, serve to explain the principles of the disclosure.

DESCRIPTION OF THE EMBODIMENTS

The disclosure will be described in detail with reference to the accompanying drawings. It is noted that for comprehension of the reader and simplicity of the drawings, in the drawings of the disclosure, only a part of the electronic device/the display device is shown, and specific components in the drawings are not necessarily drawn to scale. Moreover, the quantity and the size of each component in the drawings are only schematic and are not intended to limit the scope of the disclosure. For example, for clarity, a relative size, a thickness, and a location of each film layer, region, and/or structure may be reduced or enlarged.

Throughout the specification and the appended claims of the disclosure, certain terms are used to refer to specific components. Those skilled in the art should understand that electronic device manufacturers may probably use different names to refer to the same components. This specification is not intended to distinguish between components that have the same function but different names. In the following specification and claims, the terms "including" and "having", etc., are open-ended terms, so they should be interpreted to mean "including but not limited to . . . ".

Directional terminology mentioned in the specification, such as "top", "bottom", "front", "back", "left", "right", etc., is used with reference to the orientation of the drawings being described. Therefore, the used directional terminology is only intended to illustrate, rather than limit, the disclosure. It should be understood that when an element or layer is referred to as being "on" or "connected to" another element or layer, it can be directly set on said other element or layer or directly connected to said other element or layer, or there is an intervening element or layer between the two (indirect connection). In contrast, when an element is referred to as being "directly on" or "directly connected to" another element or layer, there are no intervening elements or layers between the two.

The terms such as "about", "equal", "same", "substantially", or "approximately" are generally interpreted as being within a range of plus or minus 10% of a given value or range, or as being within a range of plus or minus 5%, plus or minus 3%, plus or minus 2%, plus or minus 1%, or plus or minus 0.5% of the given value or range. In addition, the term "a given range is between the first value and the second value" or the term "a given value falls in the range between the first value and the second value", both mean the given range includes the first value, the second value, and values between the two values.

In some embodiments of the disclosure, terms such as "connect" and "interconnect" with respect to bonding and connection, unless specifically defined, may refer to two structures that are in direct contact with each other, or may refer to two structures that are indirectly in contact with each other, wherein there are other structures set between these two structures. In addition, the terms that describe joining and connecting may apply to the case where both structures are movable or both structures are fixed. In addition, the term "electrically connected" or "coupling" involves any direct and indirect electrical connection means.

In the exemplary embodiments provided herein, the same or similar elements will be given the same or similar reference numerals and their description will be omitted. In addition, the features in the different exemplary embodiments may be combined with each other as long as there is no conflict, and equivalent changes and modifications made according to the specification or claims are still within the scope of this disclosure. Moreover, "first", "second", and similar terms mentioned in the specification or the claims are merely used to name the discrete elements or to differentiate among different embodiments or ranges. Therefore, the terms should not be regarded as limiting the upper or lower bound of the number of the components/devices and should not be used to limit the manufacturing sequence or arrangement sequence of components.

The electronic device in the disclosure may include a display device, an antenna device, a sensing device, a light-emitting device, or a splicing device, but the disclosure is not limited thereto. The electronic device may be a bendable or flexible electronic device. The electronic device may, for example, include light-emitting diodes (LEDs). The light-emitting diodes may include, for example, organic light-emitting diodes (OLEDs), mini LEDs, micro LEDs, or quantum dot light-emitting diodes (including QLEDs and QDLEDs), fluorescence, phosphors, other suitable materials, or a combination thereof, but the disclosure is not limited thereto. A display device is configured as an electronic device to illustrate the content of the disclosure in the following, but the disclosure is not limited thereto.

The display device of the disclosure may be a self-luminous display device, for example. The self-luminous display device may include a light-emitting diode, a light conversion layer or other suitable materials, or a combination thereof, but the disclosure is not limited thereto. The light-emitting diode may, for example, include organic light-emitting diodes (OLEDs), mini light-emitting diode (mini LEDs), micro LEDs or quantum dot LEDs (including QLEDs and QDLEDs), but the disclosure is not limited thereto. The light conversion layer may include a wavelength conversion material and/or a light filtering material. The light conversion layer may include, for example, fluorescence, phosphors, quantum dots, other suitable materials, or a combination thereof, but the disclosure is not limited thereto. The display panel in the display device will be described with accompanying drawings, and the spliced display will be adapted as the display device to illustrate the content of the disclosure. However, the display device in the disclosure may also be a non-spliced display.

Figure 1:
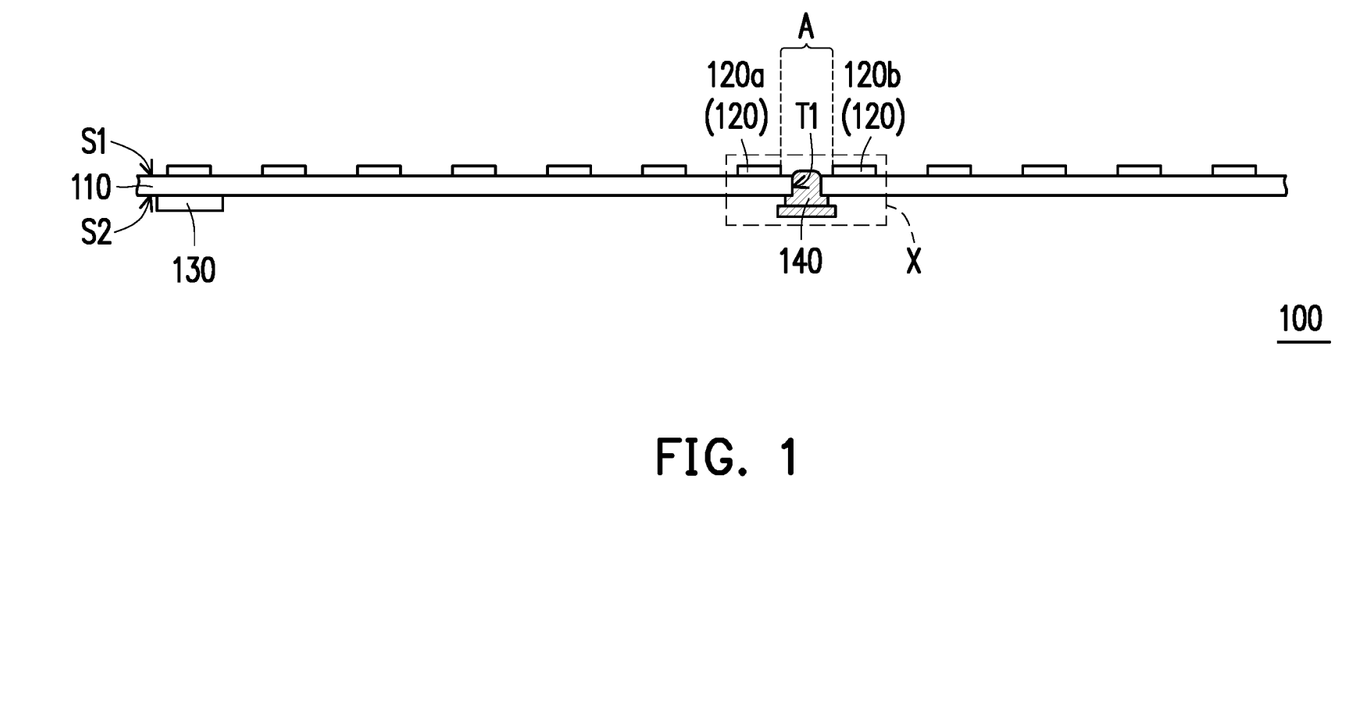
FIG. 1 is a schematic cross-sectional view of part of a display panel according to some embodiments of the disclosure.

FIG. 1 is a schematic cross-sectional view of part of a display panel according to some embodiments of the disclosure. FIG. 2 to FIG. 5 are various enlarged schematic views of part of the region X in FIG. 1.

Figure 2:
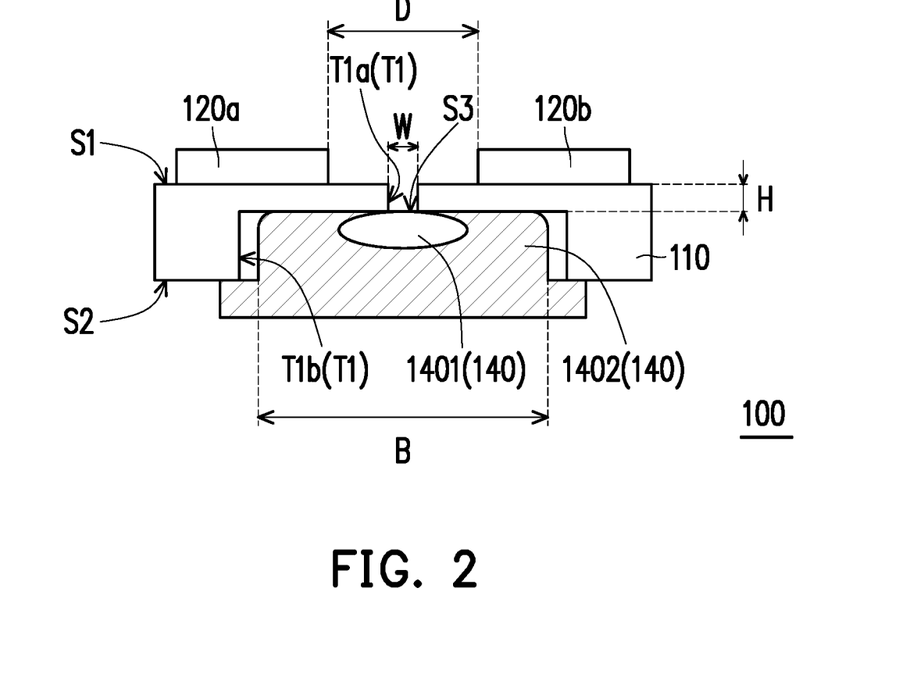
FIG. 2 to FIG. 5 are various enlarged schematic views of part of the region X in FIG. 1.

Referring to FIG. 1 and FIG. 2 first, a display panel 100 is a self-luminous display panel. The self-luminous display panel may include a light-emitting diode display panel, but the disclosure is not limited thereto. The display panel 100 may be a display panel embedded with an image capturing device. For example, one or more image capturing devices may be embedded in the display panel 100. According to different requirements, while obtaining an image of the subject, the display panel 100 displays the obtained image, but the disclosure is not limited thereto.

In detail, the display panel 100 includes a substrate 110, the plurality of the light-emitting elements 120, a driving circuit 130, and an optical sensor 140. The substrate 110 includes a rigid substrate or a flexible substrate and may also include a film-like substrate with flexibility, but the disclosure is not limited thereto. For example, the substrate 110 may include a printed circuit board, a plastic substrate, a glass substrate, or a composite substrate. For example, composite boards include polyimide (PI) and printed circuit boards, composite boards include polyimide and polyethylene terephthalate (PET), or the like, but the disclosure is not limited thereto. The plurality of the light-emitting elements 120 may include light-emitting diodes. The light-emitting diode, for example, may include organic light-emitting diodes (OLEDs), mini light-emitting diodes (mini LEDs), micro light-emitting diodes (micro LEDs), or quantum dot light-emitting diodes (quantum dot LEDs, including QLEDs and QDLEDs), fluorescence, phosphor, other suitable materials, or a combination thereof, but the disclosure is not limited thereto. The driving circuit 130 may include one or more integrated circuits, but the disclosure is not limited thereto. The optical sensor 140 includes a camera module or a fingerprint recognition module and may also include an infrared camera, a thermal imager, or other image capturing devices providing functions of ranging, position recognition, or identification, but the disclosure is not limited thereto. In some embodiments, the optical sensor 140 may include a charge-coupled device (CCD) or a CMOS image sensor (CIS), such as front side illuminated (FSI) CIS, back side illuminated (BSI) CIS, etc., to receive sensing light, but the disclosure is not limited thereto.

The substrate 110 has a surface S1 and another surface S2 opposite to the surface S1. In addition, the substrate 110 includes a through hole T1. The through hole T1 penetrates the surface S1 and the surface S2 of the substrate 110. In other words, the through hole T1 extends from the surface S1 to the surface S2.

The plurality of the light-emitting elements 120 are disposed on the substrate 110, and the plurality of the light-emitting elements 120, for example, are disposed on the surface S1 of the substrate 110. The through hole T1, for example, is located in a region A between two (e.g., the light-emitting element 120a and the light-emitting element 120b) of the plurality of the light-emitting elements.

The driving circuit 130 is disposed on the substrate 110 and electrically connected to the plurality of the light-emitting elements 120. The driving circuit 130 controls the plurality of the light-emitting elements 120 to display images. The driving circuit 130 is disposed on the surface S1 of the substrate 110 or disposed on the surface S2 of the substrate 110 to reduce its influence on the visual effect, but the disclosure is not limited thereto. In some embodiments, the driving circuit 130 may be disposed on the surface S1 of the substrate 110.

The optical sensor 140 is disposed corresponding to the through hole T1 and receives sensing light through the through hole T1. As shown in FIG. 1 and FIG. 2, for example, the through hole T1 penetrates the part of the substrate 110 located in the region A, and for example the optical sensor 140 is embedded in the through hole T1 of the substrate 110 to obtain image data of the object to be photographed by receiving sensing light.

With the optical sensor 140 disposed in the display region (e.g., the region between the light-emitting element 120a and the light-emitting element 120b) of the display panel 100, the space waste and the affected appearance caused by the external camera lens are improved, or technical problems, such as failing to directly look at the screen and the image capturing device at the same time while the users use the image capturing device, are solved.

Referring to FIG. 2, in the display panel 100, the through hole T1 is a composite through hole, but the disclosure is not limited thereto. For example, the through hole T1 includes a part T1b where the optical sensor is disposed and a hole part (a hole T1a) of the optical sensor 140 is exposed. The hole T1a is connected to the surface S1 of the substrate 110 and is located between the surface S1 and the part T1b where the optical sensor is disposed. The part T1b where the optical sensor is disposed is connected to the surface S2 of the substrate 110 and is located between the surface S2 and the hole T1a. The optical sensor 140 is disposed in the part T1b where the optical sensor is disposed, the hole T1a exposes the optical sensor 140, and the sensing light is transmitted to the optical sensor 140 through the hole T1a so that the optical sensor 140 obtains image data of the object to be photographed. In some embodiments, the part T1b where the optical sensor is disposed may be designed according to the size of the optical sensor 140 and may have an aperture greater than that of the hole T1a, but the disclosure is not limited thereto.

In the embodiment of the disclosure, when taking the image capturing effect into consideration, a width W of the hole T1a meets the following equation: $H \leq W < D$. For example, the width W of the hole T1a refers to the maximum width of the through hole T1 in a direction parallel to the substrate 110 on the surface (e.g., the surface S1) of the substrate 110 where the plurality of the light-emitting elements 120 are disposed. In FIG. 2, for example, the width W of the hole T1a is the maximum width in the direction parallel to the substrate 110 on the surface S1. H is the depth of the hole T1a, for example, the distance from the surface (e.g., surface S1) of the substrate 110 where the plurality of the light-emitting elements 120 are disposed to the surface (e.g., an upper surface S3) of the optical sensor 140 in a direction perpendicular to the substrate 110. D is the distance between the light-emitting element 120a and the light-emitting element 120b, for example, the minimum distance between the light-emitting element 120a and the light-emitting element 120b in the direction parallel to the substrate 110.

In some embodiments of the disclosure, the optical sensor 140 may be a camera module. For example, the optical sensor 140 may include a lens 1401 and a housing 1402 to carry the lens 1401. In some embodiments, if a width B of the housing 1402 of the optical sensor 140 is greater than a distance D between the light-emitting element 120a and the light-emitting element 120b, with the design of the composite through hole, at least part of the housing 1402 is embedded in the part T1b where the optical sensor is disposed in the substrate 110. Accordingly, the optical sensor 140 is fixed in the substrate 110 without increasing the distance D. In other embodiments, the optical sensor 140 may also adopt other structural configurations, which is not limited in the disclosure.

Figure 3:
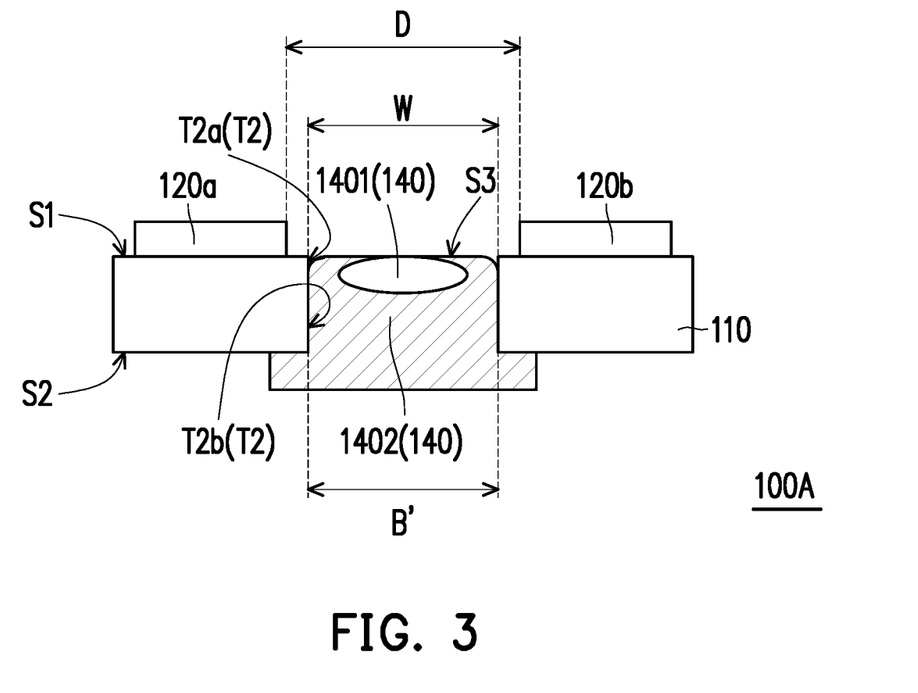

Referring to FIG. 3, in a display panel 100A, the substrate 110 includes a through hole T2. The through hole T2 includes a part T2b where the optical sensor is disposed and a hole part (a hole T2a) where the optical sensor 140 is exposed. The through hole T2 is a single through hole, and the hole T2a in the through hole T2 and the part T2b where the optical sensor is disposed have a single aperture. A width B' of part of the housing 1402 of the optical sensor 140 is less than the distance D between the light-emitting element 120a and the light-emitting element 120b. Therefore, with the design of a single through hole, the housing 1402 is embedded in the through hole T2 of the substrate 110, but the disclosure is not limited thereto. In FIG. 3, the depth of the hole is the distance from the surface S1 to the upper surface S3 of the optical sensor 140 (the defined H), and for example, the depth is 0.

Figure 4:
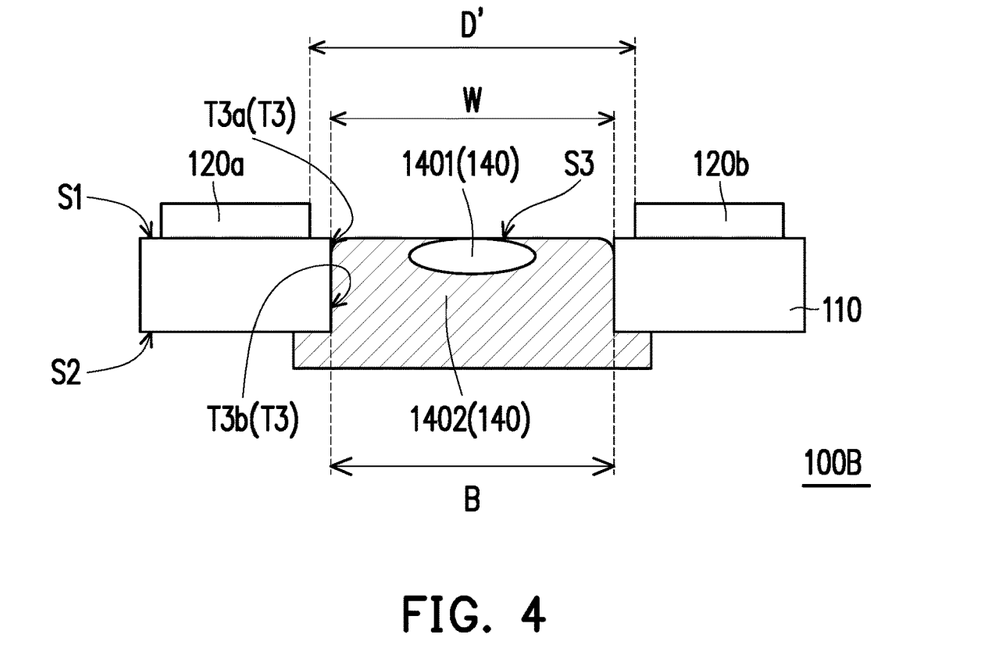

Referring to FIG. 4, in a display panel 100B, the substrate 110 includes a through hole T3. The through hole T3 includes a part T3b where the optical sensor is disposed and a hole part (a hole T3a) where the optical sensor 140 is exposed. The through hole T3 is a single through hole, and the hole T3a in the through hole T3 and the part T3b where the optical sensor is disposed have a single aperture. In some embodiments, a larger distance D' exists between the light-emitting element 120a and the light-emitting element 120b (e.g., the display panel 100B has a larger pixel pitch or a lower resolution than that of the display panel 100), and the distance D' is greater than the width B of the housing 1402 of the optical sensor 140. Therefore, in the display panel 100B, the through hole T3 with a larger aperture is disposed between the light-emitting element 120a and the light-emitting element 120b, and with the housing 1402 disposed in the through hole T3, the optical sensor 140 is disposed corresponding to the through hole T3, but the disclosure is not limited thereto. In FIG. 4, the depth of the hole is the distance from the surface S1 to the upper surface S3 of the optical sensor 140 (the defined H), and for example, the depth is 0.

Figure 5:
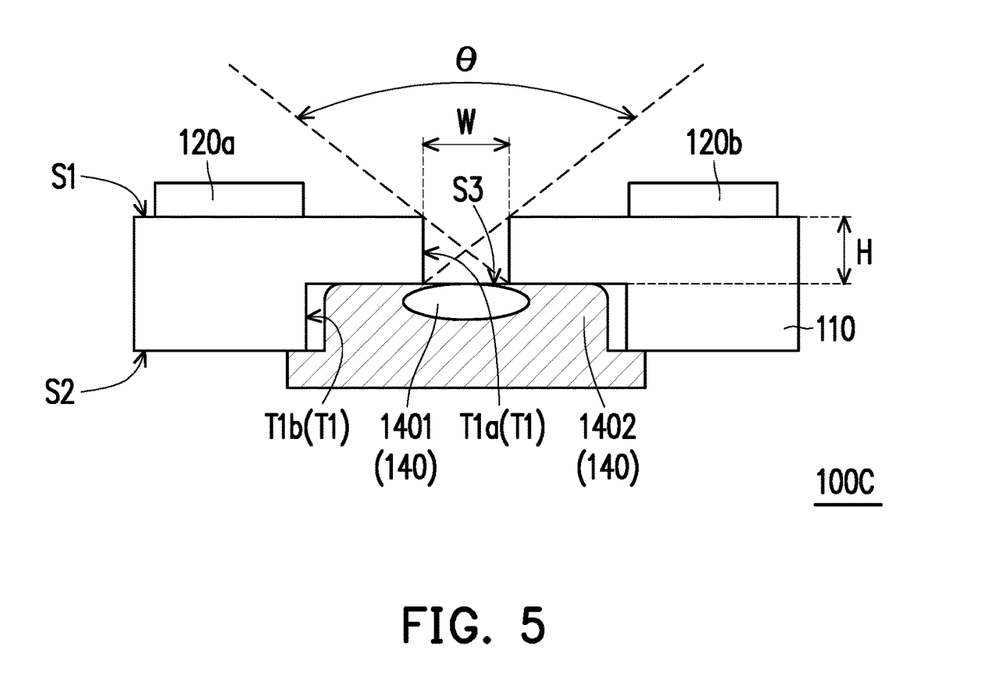

Referring to FIG. 5, in a display panel 100C, the optical sensor 140 has a viewing angle θ, where the viewing angle θ may fall within a range of ±10% of $180-[2\times \tan^{-1}(H/D)]$, for example. In other words, a distance H from the surface S1 to the upper surface S3 of the optical sensor 140 and the distance D between the light-emitting element 120a and the light-emitting element 120b may be designed according to the light collection capability (the viewing angle θ) of the optical sensor 140.

Figure 6:
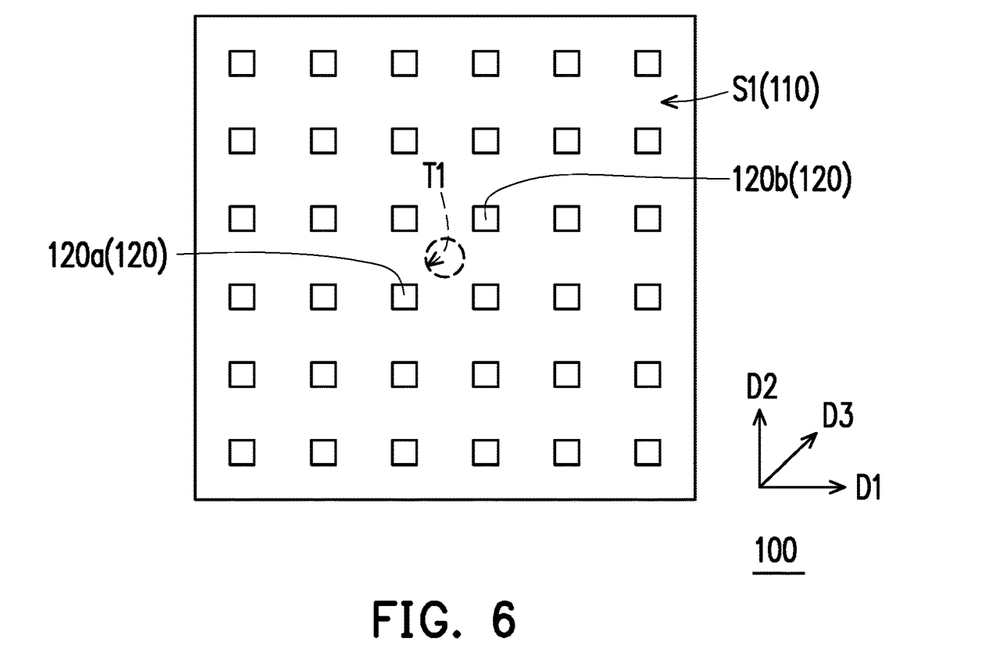
FIG. 6 to FIG. 8 are various schematic top views of the display panel in FIG. 1.
Figure 7:
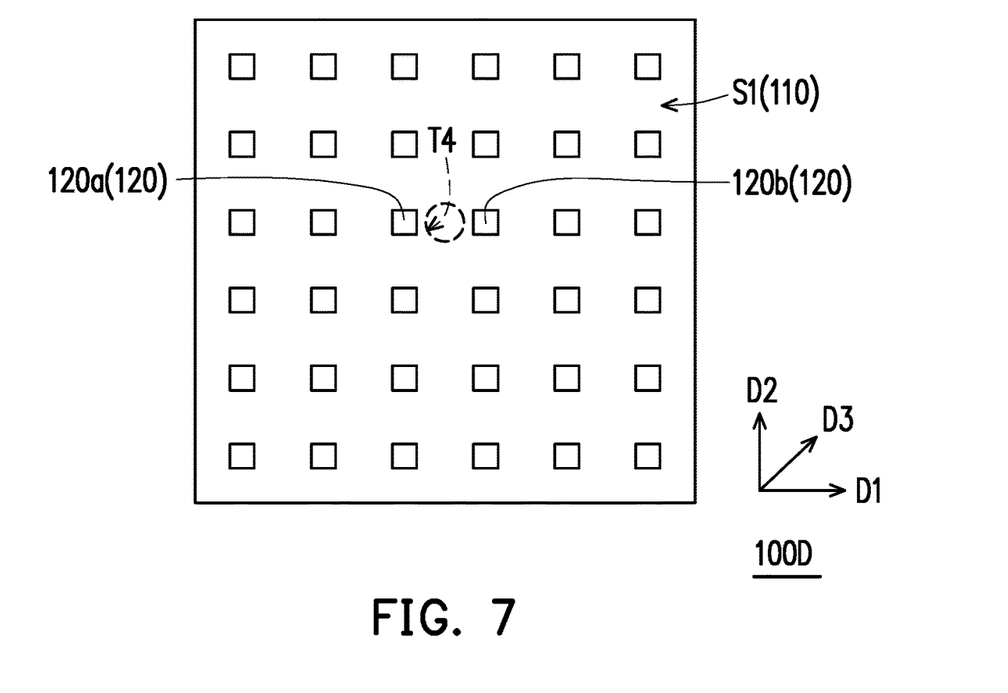
Figure 8:
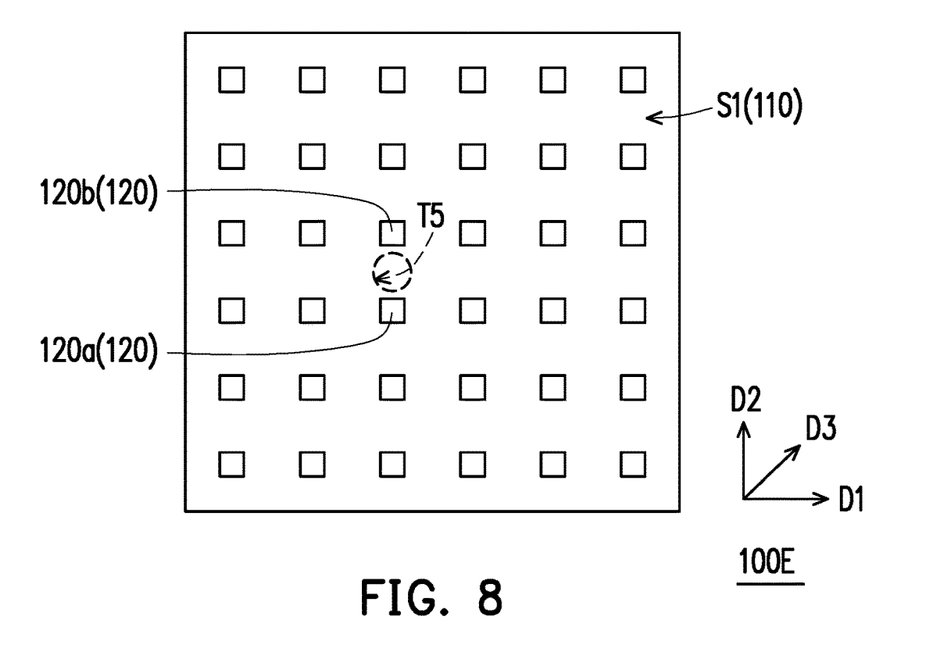

FIG. 6 to FIG. 8 are various schematic top views of the display panel in FIG. 1. Referring to FIG. 6 first, the display panel 100 includes the plurality of the light-emitting elements 120 disposed on the surface S1 of the substrate 110. The plurality of the light-emitting elements 120 are disposed in an array in a direction parallel to the substrate 110 (e.g., a first direction D1 and a second direction D2). The second direction D2 intersects the first direction D1, and for example, the second direction D2 may be perpendicular to the first direction D1, but the disclosure is not limited thereto. The first direction D1 may be a horizontal direction when the users face the display panel 100. The second direction D2 may be a vertical direction when the users face the display panel 100.

As shown in FIG. 6, in the display panel 100, the through hole T1 is located in a region between two (e.g., the light-emitting element 120a and the light-emitting element 120b) of the plurality of the light-emitting elements 120. For example, the light-emitting element 120a and the light-emitting element 120b are adjacent light-emitting elements 120 in a diagonal direction D3. The diagonal direction D3 is a diagonal direction between the first direction D1 and the second direction D2. For example, the through hole T1 may be located in the region among the four light-emitting elements 120. Alternatively, the through hole T1 may be located in the region among six, eight, or more light-emitting elements 120.

Referring to FIG. 7, in a display panel 100D, a through hole T4 is located in a region between two (e.g., the light-emitting element 120a and the light-emitting element 120b) of the plurality of the light-emitting elements 120. For example, the light-emitting element 120a and the light-emitting element 120b are adjacent light-emitting elements 120 in the horizontal direction (e.g., the first direction D1).

Referring to FIG. 8, in a display panel 100E, a through hole T5 is located in a region between two (e.g., the light-emitting element 120a and the light-emitting element 120b) of the plurality of the light-emitting elements 120. For example, the light-emitting element 120a and the light-emitting element 120b are adjacent light-emitting elements 120 in the vertical direction (e.g., the second direction D2).

Figure 9:
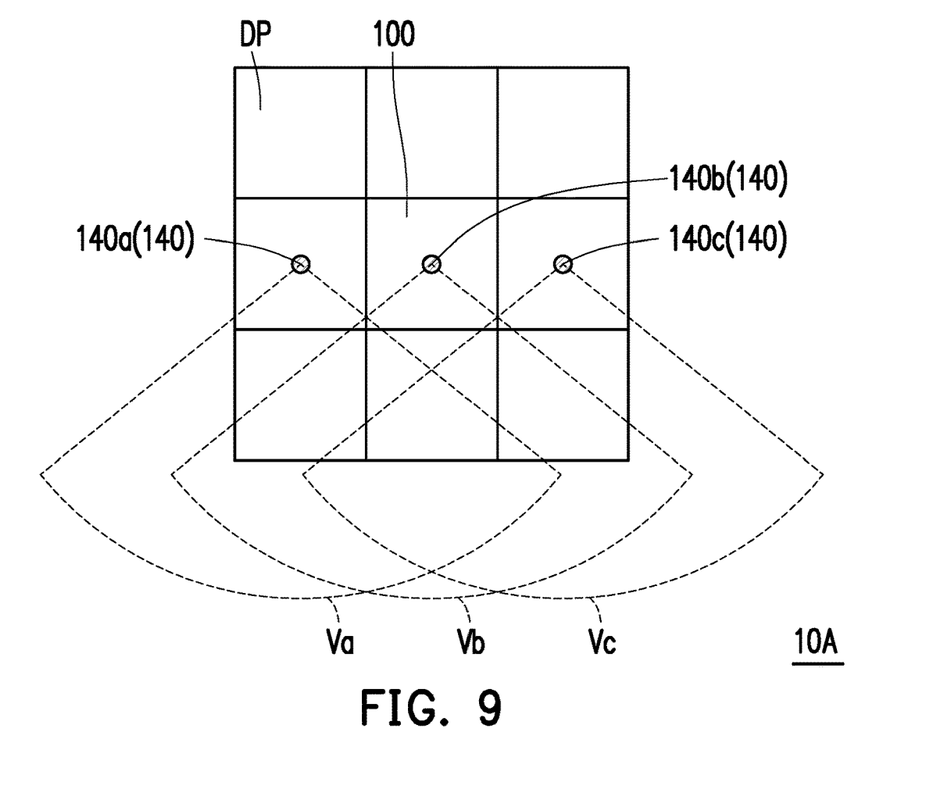
FIG. 9 is a schematic view of a spliced display according to some embodiments of the disclosure.

FIG. 9 is a schematic view of a spliced display according to some embodiments of the disclosure. Referring to FIG. 9, a spliced display 10A includes a plurality of display panels DP. In some embodiments, some of the plurality of the display panels DP in the spliced display 10A may have driving circuits electrically coupled to one another, so that some of the plurality of the display panels DP in the spliced display 10A cooperatively display the entire or the corresponding images.

As shown in FIG. 9, the spliced display 10A may include at least two display panels 100 as shown in FIG. 1, FIG. 2, and FIG. 6. Through the optical sensor 140, the spliced display 10A obtains image data of the object to be photographed. The spliced display 10A may also include the display panel 100A of FIG. 3, the display panel 100B of FIG. 4, the display panel 100C of FIG. 5, the display panel 100D of FIG. 7, the display panel 100E of FIG. 8, or a combination thereof. The disclosure is not limited thereto.

The spliced display 10A may include one optical sensor 140 or multiple optical sensors 140. The spliced display 10A may include a plurality of display panels including optical sensors 140, and may also include a display panel including a plurality of optical sensors 140. The plurality of the optical sensors 140 may be respectively disposed in different display panels DP, or the plurality of the optical sensors 140 may be disposed on one display panel DP. The spliced display 10A may also include a display panel without the optical sensor 140, which is not limited in the disclosure. The plurality of the optical sensors 140 provides multiple shooting angles and a wider shooting range. For example, the spliced display 10A may include an optical sensor 140a, an optical sensor 140b, and an optical sensor 140c; and the optical sensor 140a, the optical sensor 140b, and the optical sensor 140c obtain image data in a range Va, a range Vb, and a range Vc, respectively. Therefore, the optical sensor 140a, the optical sensor 140b, and the optical sensor 140c respectively track and photograph objects to be photographed in different regions.

Figure 10:
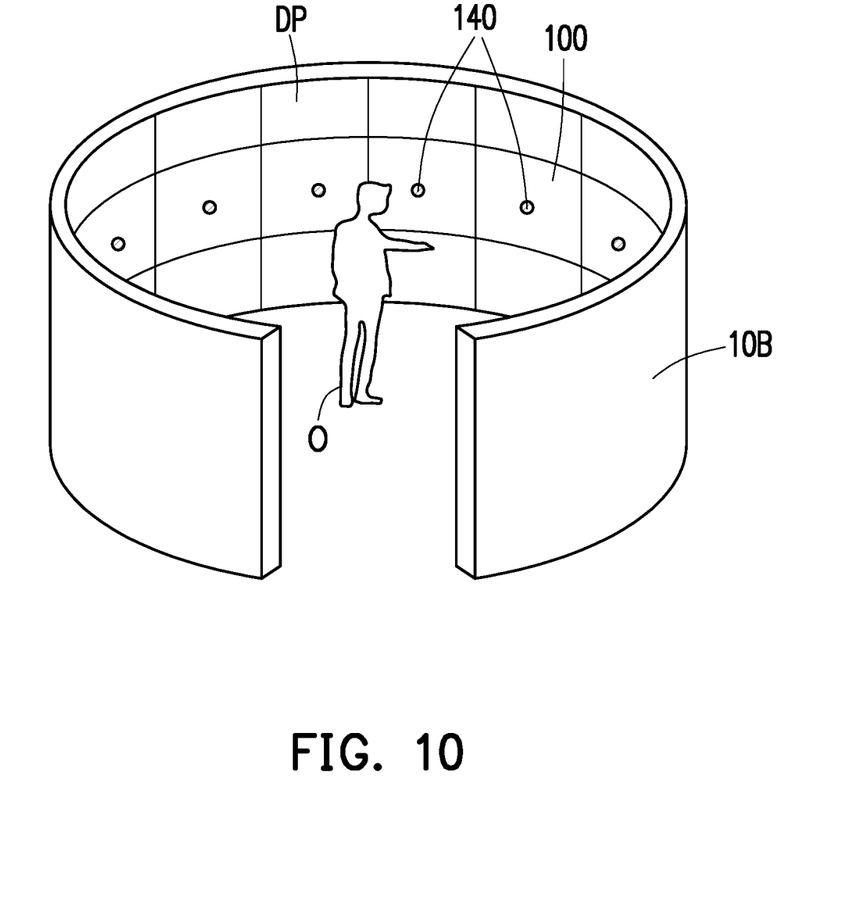
FIG. 10 is a schematic view of another spliced display according to some embodiments of the disclosure.

FIG. 10 is a schematic view of another spliced display according to some embodiments of the disclosure. Referring to FIG. 10, a spliced display 10B is ring-shaped and includes a plurality of display panels DP. The plurality of the display panels DP may include one or more curved display panels, but the disclosure is not limited thereto. FIG. 10 shows the spliced display 10B disposed inside the ring. However, in other embodiments, the spliced display may also be disposed outside the ring or disposed in other shapes, and this disclosure is not limited thereto. In some embodiments, some of the plurality of the display panels DP in the spliced display 10B may have driving circuits electrically coupled to one another, so that some of the plurality of the display panels DP of the spliced display 10B cooperatively display the entire or the corresponding images.

As shown in FIG. 10, the spliced display 10B includes at least one display panel 100 as shown in FIG. 1, FIG. 2, and FIG. 6. Through the optical sensor 140, the spliced display 10B obtains image data of an object O to be photographed. The spliced display 10B may also include the display panel 100A of FIG. 3, the display panel 100B of FIG. 4, the display panel 100C of FIG. 5, the display panel 100D of FIG. 7, the display panel 100E of FIG. 8, or a combination thereof, but the disclosure is not limited thereto.

The spliced display 10B may include one optical sensor 140 or a plurality of optical sensors 140. The spliced display 10B may include a plurality of display panels including optical sensors 140 or may also include a display panel including a plurality of optical sensors 140. The plurality of the optical sensors 140 may be respectively disposed in different display panels, or the plurality of the optical sensors 140 may be disposed on one display panel. The spliced display 10B may also include a display panel without the optical sensor 140, which is not limited in the disclosure. The plurality of the optical sensors 140 provide multiple shooting angles and a wider shooting range. For example, the plurality of the optical sensors 140 of the spliced display 10B obtain a three-dimensional image of the object O to be photographed, and it is possible to further combine the obtained three-dimensional image with the display image of the spliced display 10B to present real time virtual reality images. In some embodiments, a spliced display including an optical sensor may also integrate a signage system with a monitoring system.

Based on the above, in the embodiments of the disclosure, with an optical sensor disposed in the display region (e.g., the region between two light-emitting elements) of a display panel or that of a spliced display, the space waste and the affected appearance caused by the external camera lens are improved, or technical problems, such as failing to directly look at the screen and the image capturing device at the same time while the users use the image capturing device, are solved, thereby further contributing to optimizing the circuit configuration of the peripheral area of the panel and the user experience.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

Although the disclosure has been described with reference to the above embodiments and the features, it will be apparent to one of ordinary skill in the art that modifications and changes to the described embodiments may be made without departing from the spirit and the scope of the disclosure. In addition, the protection scope of the disclosure is not limited to the manufacturing processes, machines, manufacturing, material composition, devices, methods, and steps in the specific embodiments of the specification. Any skilled in the art can understand the current or future development processes, machines, manufacturing, material composition, devices, methods, and steps from the content of the disclosure, and as long as the substantially same functions can be implemented in the embodiments described herein or the substantially same results can be obtained, they can be used according to the disclosure. Therefore, the protection scope of the disclosure includes the above manufacturing processes, machines, manufacturing, material composition, devices, methods, and steps. In addition, each claim constitutes an individual embodiment, and the protection scope of the disclosure also includes the combination of each claim and embodiment. The protection scope of the disclosure shall be defined by the appended claims.

What is claimed is:

1. An electronic device, comprising:
a substrate comprising an upper surface and a through hole;
a plurality of light-emitting elements disposed on the upper surface of the substrate, wherein the through hole is located in a region between two of the plurality of the light-emitting elements; and
an optical sensor overlapped with the through hole in a normal direction of the electronic device and receiving light through the through hole;
wherein, in a cross-sectional view of the electronic device, a width W of the through hole on the upper surface of the substrate meets a following equation:

$$H \leq W < D,$$

wherein H is a first distance from the upper surface of the substrate to an upper surface of the optical sensor, and D is a second distance between the two of the plurality of the light-emitting elements.

2. The electronic device according to claim 1, wherein the optical sensor is a camera module.

3. The electronic device according to claim 1, further comprising:
a driving circuit disposed on the substrate and electrically connected to the plurality of the light-emitting elements.

4. The display panel according to claim 3, wherein the driving circuit is disposed on the upper surface of the substrate.

5. The electronic device according to claim 1, wherein the optical sensor comprises a housing, and a width of the housing is greater than D.

6. The electronic device according to claim 1, wherein the plurality of the light-emitting elements are light-emitting diodes.

7. The electronic device according to claim 6, wherein the light-emitting diodes are organic light-emitting diodes.

8. The electronic device according to claim 6, further comprising:
a light conversion layer disposed on the light-emitting diodes.

9. The electronic device according to claim 8, wherein the light conversion layer comprises quantum dots.

* * * * *